(12) United States Patent
You et al.

(10) Patent No.: US 10,949,018 B2
(45) Date of Patent: Mar. 16, 2021

(54) DISPLAY MODULE AND DISPLAY DEVICE HAVING THE SAME

(71) Applicant: SAMSUNG DISPLAY CO., LTD., Yongin-si (KR)

(72) Inventors: Chungi You, Asan-si (KR); Taeik Kim, Asan-si (KR); Hyunsik Park, Cheonan-si (KR); Sungho Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/692,111

(22) Filed: Nov. 22, 2019

(65) Prior Publication Data
US 2020/0167054 A1 May 28, 2020

(30) Foreign Application Priority Data
Nov. 23, 2018 (KR) .......................... 10-2018-0146251

(51) Int. Cl.
*G06F 3/041* (2006.01)
*H01L 51/52* (2006.01)
*H01L 27/32* (2006.01)

(52) U.S. Cl.
CPC ........ *G06F 3/04164* (2019.05); *H01L 27/323* (2013.01); *H01L 51/5246* (2013.01); *H01L 51/5253* (2013.01); *H01L 27/3244* (2013.01); *H01L 51/5281* (2013.01); *H01L 2251/5338* (2013.01)

(58) Field of Classification Search
None
See application file for complete search history.

(56) References Cited

U.S. PATENT DOCUMENTS

| | | |
|---|---|---|
| 2011/0057893 A1 | 3/2011 | Kim et al. |
| 2015/0185903 A1* | 7/2015 | Park ...................... G06F 3/0443 345/173 |
| 2017/0364194 A1 | 12/2017 | Jang et al. |

FOREIGN PATENT DOCUMENTS

| | | |
|---|---|---|
| KR | 10-1082293 | 11/2011 |
| KR | 10-2015-0062528 | 6/2015 |
| KR | 10-2016-0041541 | 4/2016 |
| KR | 10-2016-0099791 | 8/2016 |
| KR | 10-2017-0142243 | 12/2017 |

* cited by examiner

*Primary Examiner* — Nicholas J Lee
(74) *Attorney, Agent, or Firm* — F. Chau & Associates, LLC

(57) ABSTRACT

The display module includes a display panel and an input sensing unit disposed on the display panel that includes an active area and a non-active area adjacent to the active area. The input sensing unit includes a first conductive layer that includes a plurality of sensing electrodes that overlap the active area and a plurality of auxiliary lines that overlap the non-active area and are electrically connected to the sensing electrodes, a first insulation layer that includes a plurality of contact holes that respectively overlap the auxiliary lines and are disposed on the first conductive layer, a second conductive layer that includes a plurality of sensing lines that overlap the non-active area and respectively contact the auxiliary lines through the contact holes, and a second insulation layer disposed on the second conductive layer.

19 Claims, 13 Drawing Sheets

DISPLAY MODULE AND DISPLAY DEVICE HAVING THE SAME

CROSS-REFERENCE TO RELATED APPLICATIONS

This U.S. non-provisional patent application claims priority under 35 U.S.C. § 119 from, and the benefit of, Korean Patent Application No. 10-2018-0146251, filed on Nov. 23, 2018 in the Korean Intellectual Property Office, the contents of which are herein incorporated by reference in their entirety.

BACKGROUND

Technical Field

Embodiments of the present disclosure are directed to a display device, and more particularly, to a display module and a display device having the same.

Discussion of the Related Art

Various display devices used in multimedia equipment such as televisions, mobile phones, table computers, navigation devices, and game consoles are being developed.

Such display devices include a display panel on which an image is displayed. The display panel includes a plurality of scan lines, a plurality of data lines, and a plurality of pixels connected to the plurality of scan lines and the plurality of data lines. In addition, the display device includes a display area on which an image is displayed and a non-display area adjacent to the display area.

In addition, a display device includes an input sensing unit that can sense an external input. The input sensing unit includes a plurality of sensing sensors and a plurality of sensing lines connected to the sensing sensors.

When a display device is manufactured, one or more of the sensing lines can be disconnected by an external impact or a foreign substance. In this case, driving signals may not be transmitted to the sensing sensors due to the disconnected sensing lines, which reduces reliability of the display device.

SUMMARY

Embodiments of present disclosure provide a display module that has improved reliability, and a display device having the same.

An embodiment of the inventive concept provides a display module, including: a display panel; and an input sensing unit disposed on the display panel and that includes an active area and a non-active area adjacent to the active area. The input sensing unit includes: a first conductive layer that includes a plurality of sensing electrodes that overlap the active area and a plurality of auxiliary lines that overlap the non-active area and are electrically connected to the sensing electrodes; a first insulation layer that includes a plurality of contact holes that respectively overlap the auxiliary lines and are disposed on the first conductive layer, a second conductive layer that includes a plurality of sensing lines that overlap the non-active area and respectively contact the auxiliary lines through the contact holes; and a second insulation layer disposed on the second conductive layer.

In an embodiment, a first auxiliary line of the auxiliary lines may entirely overlap the first sensing line of the sensing lines.

In an embodiment, the first auxiliary line and the first sensing line may contact each other through a first contact hole of the contact holes, and the first contact hole may extend along a length of the first auxiliary line.

In an embodiment, the first auxiliary line and the first sensing line may contact each other through a first contact hole of the contact holes, and the first contact hole may include a plurality of sub contact holes spaced apart from each other in a plan view. The sub contact holes may be arranged along a length of the first auxiliary line.

In an embodiment, the second conductive layer may further include a plurality of pads that overlap the non-active area and are respectively connected to the sensing lines, and the first conductive layer may further include a plurality of auxiliary pads respectively connected to the auxiliary lines.

In an embodiment, the first insulation layer may further include a plurality of auxiliary contact holes, and the auxiliary pads may respectively contact the pads through the auxiliary contact holes.

In an embodiment, one end of each of the auxiliary lines may be directly connected to each of the sensing electrodes.

In an embodiment, the second insulation layer may cover each of the sensing lines, be disposed on the first insulation layer, and does not overlap at least a portion of the non-active area.

In an embodiment, the sensing electrodes may include a plurality of first sensing patterns that overlap the active area and a plurality of second sensing patterns spaced apart from the first sensing patterns in a plan view, the second conductive layer may further include a plurality of first connection patterns that connect two adjacent first sensing patterns to each other, and the first conductive layer may further include a plurality of second connection patterns that connect two adjacent second sensing patterns to each other.

In an embodiment, the second insulation layer may cover each of the first connection patterns and is disposed on the first insulation layer, and the second insulation layer does not overlap at least a portion of the active area.

In an embodiment, the second insulation layer does not overlap the second sensing patterns and a portion of the first sensing patterns.

In an embodiment, each of the first sensing patterns, the second sensing patterns, and the second connection patterns may include a transparent conductive oxide, and each of the first connection patterns and the sensing lines may include a metal.

In an embodiment, the display panel may include: a base substrate; a display element layer disposed on the base substrate; and an encapsulation layer that seals the display element layer, wherein the sensing electrodes and the auxiliary lines may be disposed on the encapsulation layer.

In an embodiment, the display module may further include a sealant that connects the encapsulation layer to the base substrate.

In an embodiment of the inventive concept, a display device includes: a display module that includes an active area on which an external input is sensed and a non-active area adjacent to the active area; and a window disposed on the display module. The display module includes: a first conductive layer that includes a plurality of sensing electrodes that overlap the active area and a plurality of auxiliary lines that overlap the non-active area and are electrically connected to the sensing electrodes; an insulation layer that includes a plurality of contact holes that respectively overlap the auxiliary lines and are disposed on the first conductive layer; and a second conductive layer that includes a plurality of sensing lines that overlap the non-active area and respectively contact the auxiliary lines through the contact holes.

In an embodiment, the auxiliary lines may entirely overlap the sensing lines, respectively.

In an embodiment, the display device may further include an auxiliary insulation layer disposed on the second conductive layer, wherein the auxiliary insulation layer does not overlap a portion of each of the active area and the non-active area.

In an embodiment, each of the sensing electrodes and the auxiliary lines may be made of a transparent conductive oxide, and each of the sensing lines may be made of a metal.

In an embodiment of the inventive concept, a display module includes: a display panel; and an input sensing unit disposed on the display panel and that includes an active area and a non-active area adjacent to the active area. The input sensing unit includes a first conductive layer that includes a plurality of sensing electrodes that overlap the active area and a plurality of auxiliary lines that overlap the non-active area and are electrically connected to the sensing electrodes; a first insulation layer that includes a plurality of contact holes that respectively overlap the auxiliary lines and are disposed on the first conductive layer; and a second conductive layer that includes a plurality of sensing lines that overlap the non-active area and respectively contact the auxiliary lines through the contact holes. A first auxiliary line of the auxiliary lines entirely overlaps a first sensing line of the sensing lines, and the first auxiliary line and the first sensing line are in contact each other.

In an embodiment, the display module may further include a second insulation layer disposed on the second conductive layer. The second insulation layer may cover each of the sensing lines, may be disposed on the first insulation layer, and does not overlap at least a portion of the non-active area.

DETAILED DESCRIPTION

Figure 1:
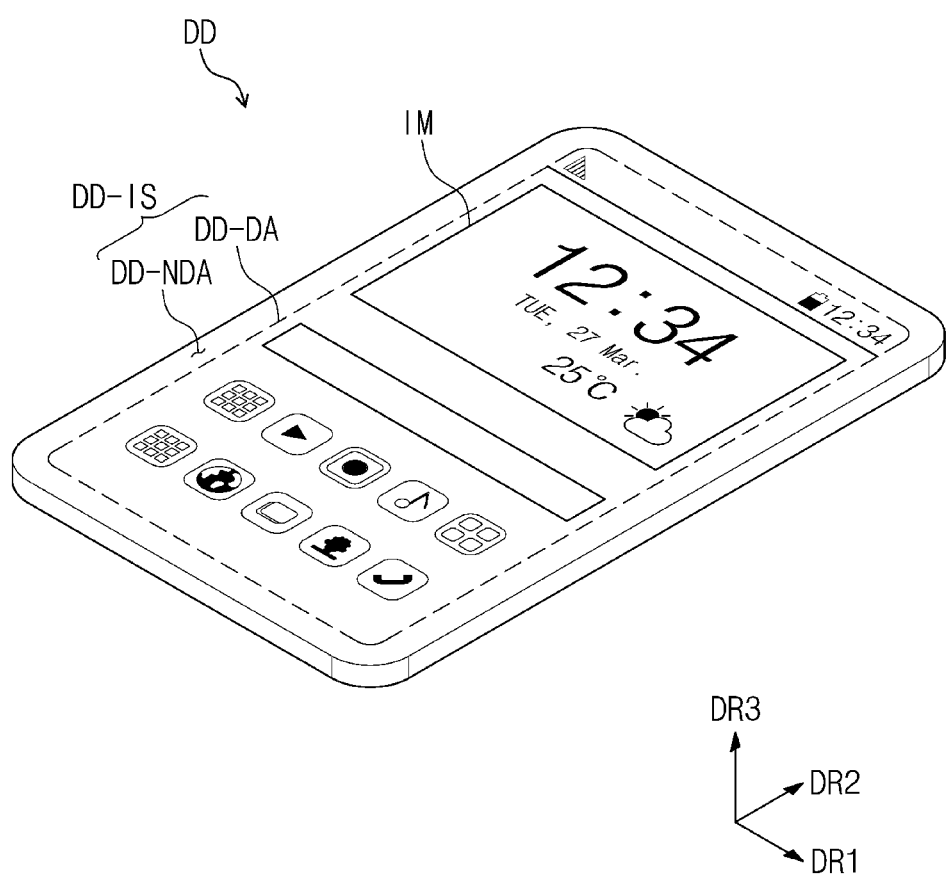
FIG. 1 is a perspective view of a display device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals may refer to like elements throughout. In the figures, the thickness, ratio, and dimensions of components may be exaggerated for clarity of illustration.

Hereinafter, exemplary embodiments of the inventive concept will be described with reference to the accompanying drawings.

Figure 2:
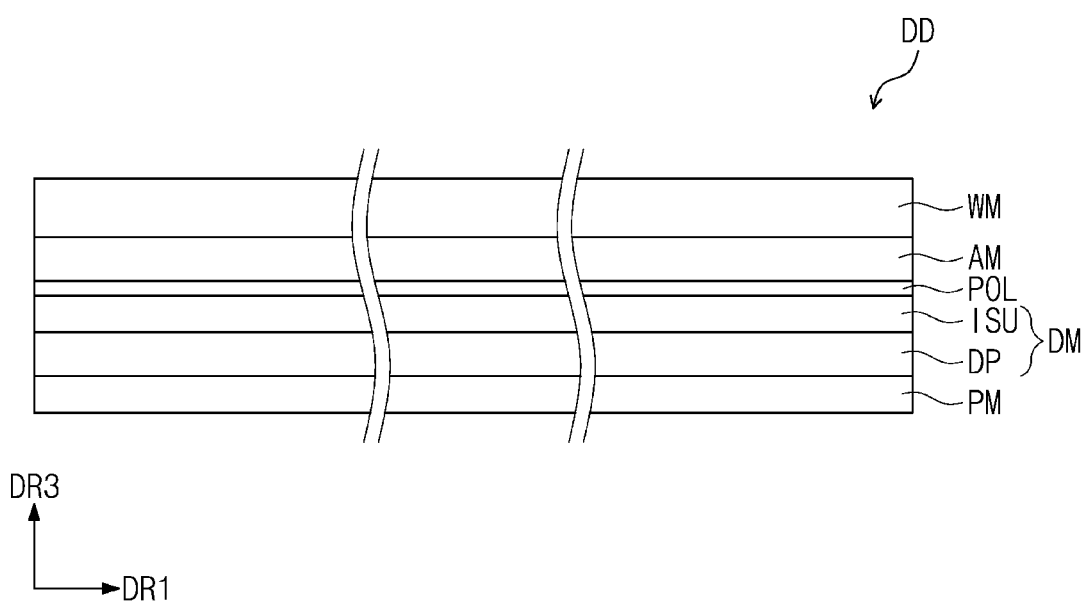
FIG. 2 is a cross-sectional view of a display device according to an embodiment of the inventive concept.

FIG. 1 is a perspective view of a display device according to an embodiment of the inventive concept. FIG. 2 is a cross-sectional view of a display device according to an embodiment of the inventive concept;

According to an embodiment, a display device DD that can be incorporated into a mobile terminal is illustrated. In addition, other electronic modules, a camera module, a power module, etc., that are mounted on a main board are disposed on a bracket/case together with the display device DD to constitute the mobile terminal. Furthermore, the display device DD according to an embodiment of the inventive concept can be incorporated into large-sized electronic apparatuses such as televisions and monitors, and small and middle-sized electronic apparatuses such as tablet PCs, vehicle navigation units, game consoles, and smart watches.

Referring to FIG. 1, according to an embodiment, a display device DD displays an image IM through a display surface DD-IS. A watch display window and an application icon are illustrated as examples of the image IM. The display surface DD-IS includes a display area DD-DA on which an image IM is displayed and a non-display area DD-NDA that is adjacent to the display area DD-DA. The non-display area DD-NDA is an area on which an image is not displayed.

For example, according to an embodiment, the non-display area DD-NDA surrounds the display area DD-DA. However, embodiments of the inventive concept are not limited thereto. For example, in other embodiments, the non-display area DD-NDA may be adjacent to only a portion of the display area DD-DA or may be omitted altogether.

According to an embodiment, a display surface DD-IS has a shape that extends in a first direction DR1 and a second direction DR2 that crosses the first direction DR1. A normal direction of the display surface DD-IS, i.e., a thickness direction of the display device DD, is indicated as a third direction DR3. In this specification, "in a plan view or in the plan view" means a case when viewed in the third direction DR3. A front (or top) surface and a rear (or bottom) surface of each of layers or units, which will be described below, can be distinguished from each other by the third direction DR3. However, directions indicated as the first to third direction DR1, DR2, and DR3 may be transformed into different directions, for example, opposite directions.

According to an embodiment, the display device DD includes a planar display surface, but embodiments are not limited thereto. For example, the display device DD may include a solid display surface. The solid display surface includes a plurality of display areas that indicate different directions. For example, the solid display surface includes polygonal display surfaces.

In addition, according to an embodiment, the display device DD is a rigid display device. However, embodiments of the inventive concept are not limited thereto. For example, in other embodiments, the display device DD is a flexible display device.

Referring to FIG. 2, according to an embodiment, the display device DD includes a protection layer PM, a display module DM, a polarization layer POL, an adhesion layer AM, and a window WM.

According to an embodiment, the window WM is disposed above the display module DM and transmits an image received from the display module DM through a transmission area TA. The window WM corresponds to the display surface DD-IS of the display device of FIG. 1.

In detail, according to an embodiment, the window WM includes a transmission area TA and a non-transmission area NTA. The transmission area TA overlaps the display area DD-DA and corresponds to the display area DD-DA. The image IM displayed on the display area DD-DA of the display device DD is externally visible through the transmission area TA of the window WM.

According to an embodiment, the non-transmission area NTA overlaps the non-display area DD-NDA and corresponds to the non-display area DD-NDA. The non-transmission area NTA has a light transmittance that is less than that of the transmission area TA. However, embodiments of the inventive concept are not limited thereto, and the non-transmission area NTA may be omitted.

According to an embodiment, the window WM may be made of glass, sapphire, or plastic. In addition, although the window WM is provided as a single layer, the window WM may include a plurality of layers. For example, the window WM may include a base layer and at least one printed layer that overlap the non-transmission area NTA and are disposed on a rear surface of the base layer. The printed layer has a predetermined color. For example, the printed layer may be black or another color besides black.

According to an embodiment, the display module DM is disposed between the protection layer PM and the polarization layer POL. The adhesion layer AM adheres the window WM and the polarization layer POL to each other. In addition, if the polarization layer POL is omitted, the adhesion layer AM adheres the window WM and the display module DM to each other.

According to an embodiment, the display module DM includes a display panel DP and an input sensing unit ISU.

According to an embodiment, the display panel DP generates an image and transmits the generated image to the window WM. The display panel DP may be an organic light emitting display panel, a liquid crystal display panel, or a quantum dot light emitting display panel, but embodiments are not limited thereto. An organic light emitting display panel includes organic light emitting elements. A liquid crystal display panel includes liquid crystal molecules. A quantum dot light emitting display panel includes quantum dots and quantum rods.

Hereinafter, an organic light emitting display panel will be described as an example of the display panel DP according to an embodiment of the inventive concept. However, embodiments of the inventive concept are not limited thereto, and various other types of display panels may be incorporated into the present disclosure according to embodiments.

According to an embodiment, the input sensing unit ISU is disposed between the window WM and the display panel DP. The input sensing unit ISU senses an externally applied input. The externally applied input can be received in various ways. For example, the external input can be applied by a portion of user's body, a stylus pen, light, heat, pressure, etc. In addition, an input through contact with a portion of a user's body such as a user's hands as well as adjacent or neighboring space touches, such as hovering, are also forms of input.

According to an embodiment, the input sensing unit ISU is disposed directly on the display panel DP. The input sensing unit ISU is manufactured by a continuous process together with the display panel DP. However, embodiments of the inventive concept are not limited thereto. For example, the input sensing unit ISU may be provided as an individual panel and then be coupled to the display panel DP through an adhesion member.

According to an embodiment, the polarization layer POL is disposed between the display module DM and the window WM. The polarization layer POL polarizes external light incident through the window WM to prevent circuit elements in the display module DM from being externally visible. According to another embodiment, the polarization layer POL is omitted.

According to an embodiment, the adhesion layer AM adheres the window WM to the polarization layer POL. If the polarization layer POL is omitted, the window WM and the display module DM are connected to each other. The adhesion layer AM may be an optically clear adhesive film (OCA), an optically clear resin (OCR), or a pressure sensitive adhesive film (PSA).

According to an embodiment, the protection layer PM prevents external moisture from permeating into the display member DM and absorbs external impacts. The protection layer PM may be made of a plastic resin. However, embodiments are not limited thereto, and the protection film PM may include an organic/inorganic composite material. For example, the protection layer PM includes a porous organic layer and an inorganic material filled into pores of the organic layer. The protection layer PM may further include a functional layer disposed on a plastic film. The functional layer includes a resin layer and formed by coating.

Figure 3A:
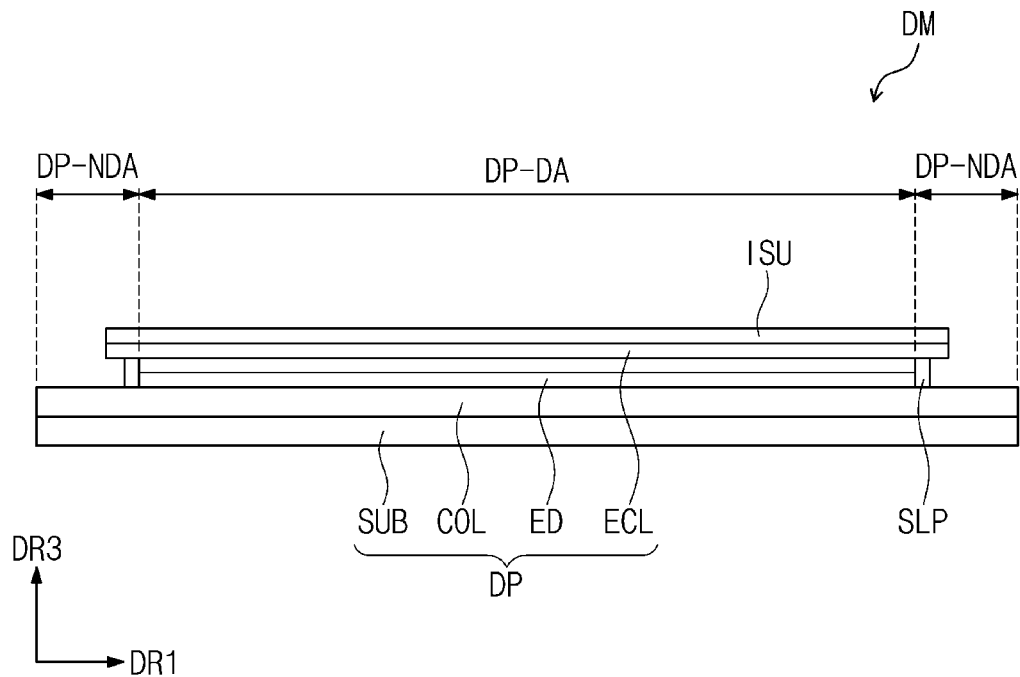
FIG. 3A is a schematic cross-sectional view of a display device according to an embodiment of the inventive concept.
Figure 3B:
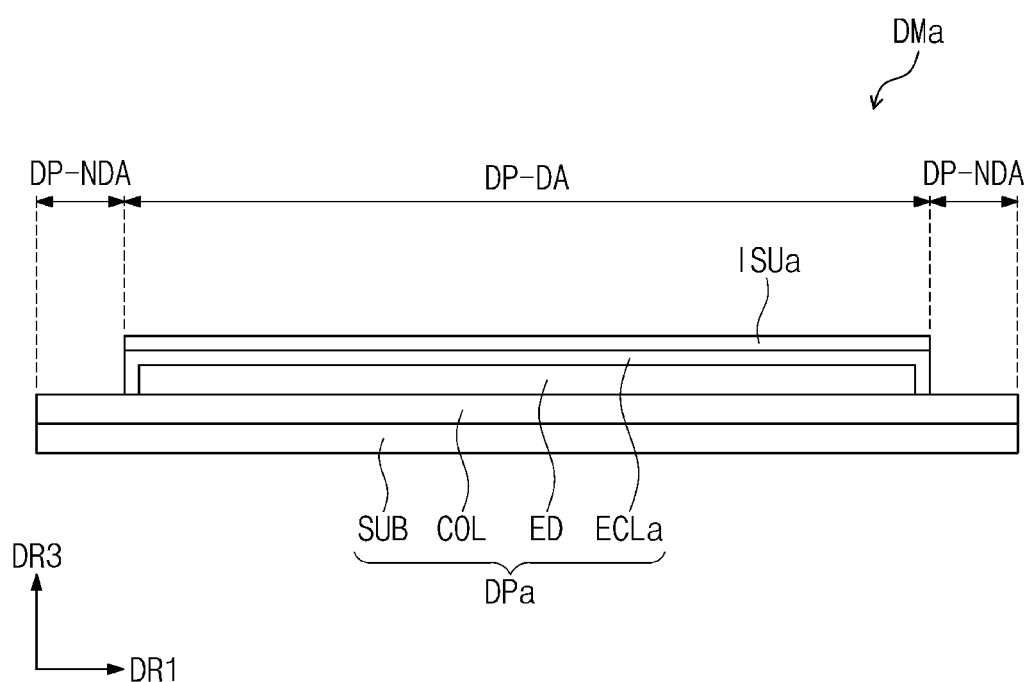
FIG. 3B is a schematic cross-sectional view of a display device according to another embodiment of the inventive concept.

FIG. 3A is a schematic cross-sectional view of a display device according to an embodiment of the inventive concept. FIG. 3B is a schematic cross-sectional view of a display device according to another embodiment of the inventive concept.

Referring to FIG. 3A, the display module DM according to an embodiment of the inventive concept will be described. The display module DM includes the display panel DP and the input sensing unit ISU, which are described with reference to FIG. 2.

According to an embodiment, the display panel DP includes a base substrate SUB, a circuit element layer COL, a display element layer ED, and an encapsulation layer ECL. The display panel DP includes a display area DP-DA and a non-display area DP-NDA. The display area DP-DA and the non-display area DP-NDA of the display panel DP correspond to the display area DD-DA and the non-display area DD-NDA of the display device DD described with reference to FIG. 1. The non-display area DP-NDA may be adjacent to one side of the display area DP-DA or may be omitted.

According to an embodiment, the base substrate SUB supports constituents and the input sensing unit ISU of the display panel DP and includes a flexible material. For example, the base substrate SUB may include a plastic substrate, a glass substrate, or an organic/inorganic composite substrate. Alternatively, the base substrate SUB has a laminated structure that includes a plurality of insulation layers. A plastic substrate includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

According to an embodiment, the circuit element layer COL includes a plurality of insulation layers, a plurality of conductive layers, and a semiconductor layer. The plurality of conductive layers of the circuit element layer COL constitute signal lines or a pixel control circuit.

According to an embodiment, the display element layer ED overlaps the display area DP-DA and is disposed on the base substrate SUB. The display element layer ED may include organic light emitting diodes. However, embodiments of the inventive concept are not limited thereto. For example, the display element layer ED includes inorganic light emitting diodes or organic-inorganic hybrid light emitting diodes, depending on the type of display panel DP.

According to an embodiment, the encapsulation layer ECL seals the display element layer ED. For example, the encapsulation layer ECL may overlap each of the display area DP-DA and the non-display area DP-NDA, or does not overlap the non-display area DP-NDA.

According to an embodiment, protects the display element layer ED from foreign substances such as moisture, oxygen, and dust particles. The encapsulation layer ECL is coupled to the base substrate SUB through a sealant SLP. The sealant SLP may include frit. However, this is an example, and the materials that form the sealant SLP are not limited thereto.

According to an embodiment, the input sensing unit ISU overlaps the display area DP-DA and is disposed on the encapsulation layer ECL.

According to an embodiment, although the input sensing unit ISU in FIG. 3A is directly formed on the encapsulation layer ECL through a continuous process, embodiments of the inventive concept are not limited thereto. For example, an adhesion member may be provided between the input sensing unit ISU and the encapsulation layer ECL, in which case the input sensing unit ISU and the encapsulation layer ECL are adhered to each other by the adhesion member.

Referring to FIG. 3B, according to an embodiment, a display module DMa includes a display panel DPa and an input sensing unit ISUa. The display module DMa of FIG. 3B is substantially the same the display module DM of FIG. 3A except for constituents of the encapsulation layer ECLa.

According to an embodiment, the display panel DPa includes a base substrate SUB, a circuit element layer COL, a display element layer ED, and an encapsulation layer ECLa.

According to an embodiment, the encapsulation layer ECLa includes at least one insulation layer. The encapsulation layer ECLa according to an embodiment of the inventive concept includes at least one organic encapsulation layer and at least one inorganic encapsulation layer.

According to an embodiment, the inorganic encapsulation layer protects the display element layer ED against moisture/oxygen, and the organic encapsulation layer protects the display element layer ED against foreign substances such as dust particles. The inorganic encapsulation layer includes a silicon nitride layer, a silicon oxynitride layer, a silicon oxide layer, a titanium oxide layer, or an aluminum oxide layer, but embodiments are not limited thereto. The organic encapsulation layer includes an acrylic-based organic layer, but embodiments are not limited thereto.

According to an embodiment, the input sensing unit ISUa is directly formed on the encapsulation layer ECLa through a continuous process. However, embodiments of the inventive concept are not limited thereto. For example, the input sensing unit ISUa may be coupled to the encapsulation layer ECLa through an adhesion member. In this case, the input sensing unit ISUa includes a base layer and a sensing circuit element layer. The sensing circuit element layer includes a plurality of insulation layers and a plurality of conductive layers.

Figure 4:
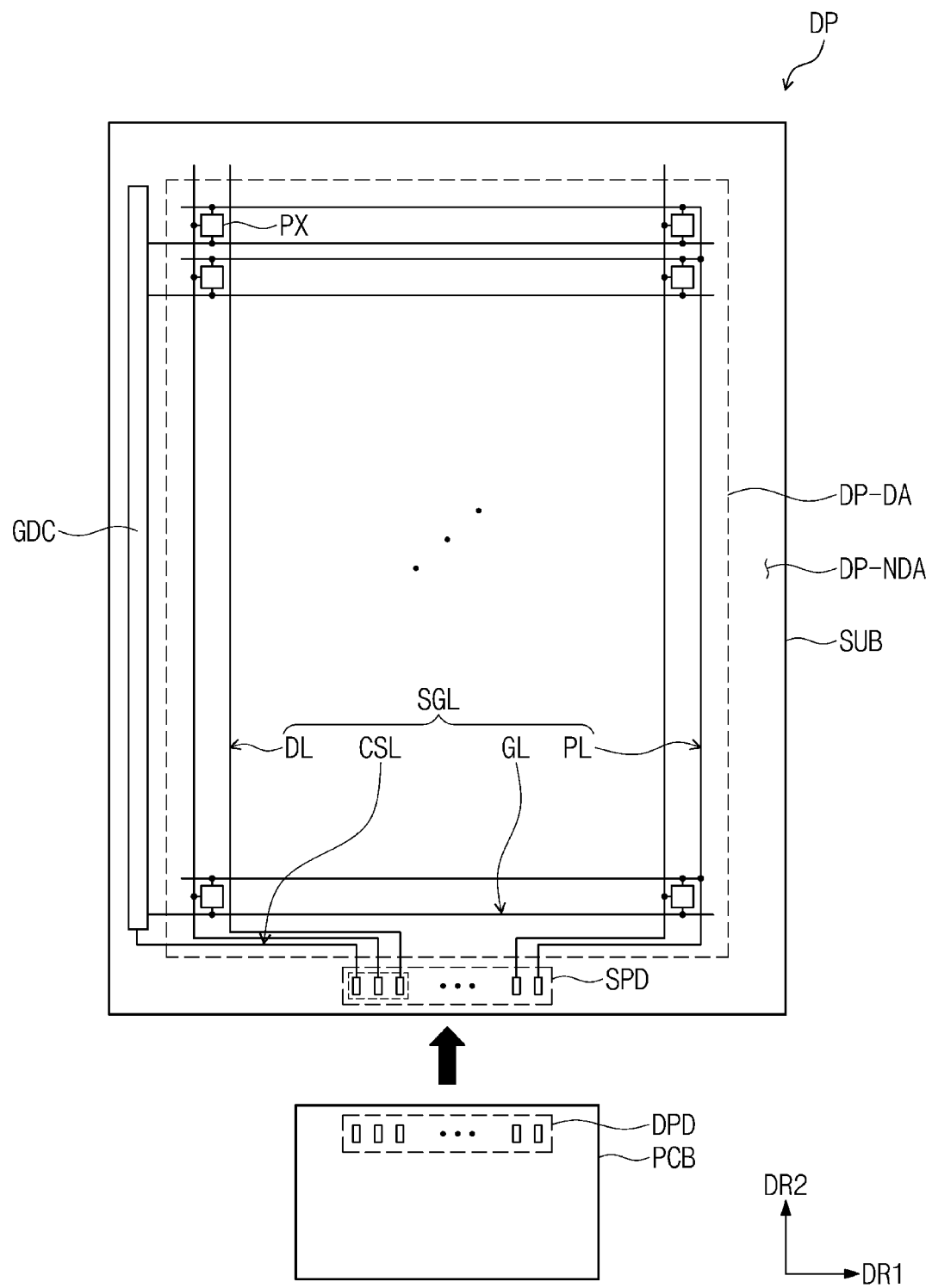
FIG. 4 is a plan view of a display panel according to an embodiment of the inventive concept.
Figure 5:
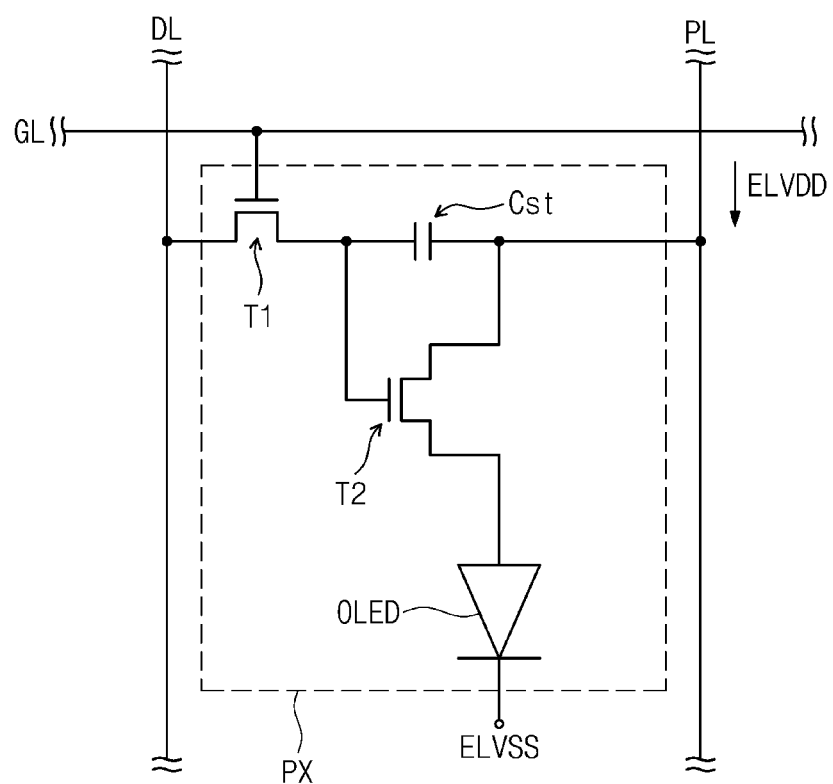
FIG. 5 is an equivalent circuit diagram of a pixel according to an embodiment of the inventive concept.

FIG. 4 is a plan view of a display panel according to an embodiment of the inventive concept. FIG. 5 is an equivalent circuit diagram of a pixel according to an embodiment of the inventive concept.

Referring to FIG. 4, according to an embodiment, the display panel DP includes a driving circuit GDC, a plurality of signal lines SGL, a plurality of pads SPD, and a plurality of pixels PX, hereinafter referred to as pixels. The pixels PX overlap the display area DP-DA. Each of the pixels PX includes an organic light emitting diode and a pixel driving circuit connected to the organic light emitting diode. The driving circuit GDC, the signal lines SGL, the pads SPD, and the pixel driving circuit are disposed in the circuit element layer COL of FIG. 3A.

According to an embodiment, the driving circuit GDC generates a plurality of scan signals, hereinafter referred to as scan signals, and sequentially outputs the scan signals to a plurality of scan lines GL, hereinafter referred to as scan lines, that will be described below. The driving circuit GDC further outputs other control signals to the driving circuit of each of the pixels PX.

According to an embodiment, the driving circuit GDC includes a plurality of thin film transistors that are manufactured through the same process as the driving circuit of the pixel PX, such as a low temperature polycrystalline silicon (LTPS) process or a low temperature polycrystalline oxide (LTPO) process.

According to an embodiment, the signal lines SGL overlap the display area DP-DA and the non-display area DP-NDA and are connected to the pads SPD. The signal lines SGL include scan lines GL, data lines DL, power lines PL, and control signal lines CSL. The scan lines GL are respectively connected to corresponding pixels PX, and the data lines DL are respectively connected to corresponding pixels PX. The power lines PL are connected to the pixels PX. The control signal lines CSL provide control signals to the driving circuit GDC.

In addition, according to an embodiment, a driving chip that electrically connects the pads PD to the signal lines SGL is disposed on the base substrate SUB and overlaps the non-display area DP-NDA. The driving chip transmits driving signals to the data lines DL and the power lines PL.

According to an embodiment, the pads SPD are disposed on one area of the base substrate SUB and overlap the non-display area DP-NDA. The pads SPD are electrically connected to a circuit board PCB and transmit driving signals received from the circuit board PCB to the signal lines SGL. The circuit board PCB may be rigid or flexible. For example, the circuit board PCB may be provided as a flexible printed circuit board.

According to an embodiment, the circuit board PCB is electrically connected to the display panel DP and transmits a plurality of driving signals to the display panel DP. For example, the circuit board PCB transmits the driving signals to the display panel DP that drive the driving circuit GDC and the pixels PX. In addition, the circuit board PCB includes driving pads DPD electrically connected to the pads SPD that transmit the driving signals to the pads SPD. The driving pads PDP overlap the pads SPD in the plan view and are electrically connected to the pads SPD.

Referring to FIG. 5, according to an embodiment, one scan line GL, one data line DL, one power line PL, and one pixel PX connected to the scan line GL, the data line DL, and the power line PL are illustrated. However, the configuration of the pixel PX is not limited to that of FIG. 5, and can vary in other embodiments.

An organic light emitting diode OLED may be a top emission-type diode or a bottom emission-type diode. According to an embodiment, the pixel PX includes a first or switching transistor T1, a second or driving transistor T2, and a capacitor Cst as the pixel driving circuit that drives the organic light emitting diode OLED. A first power voltage ELVDD is provided to the second transistor T2, and a second power voltage ELVSS is provided to the organic light emitting diode OLED. The second power voltage ELVSS is less than the first power voltage ELVDD.

According to an embodiment, the first transistor T1 outputs a data signal received from the data line DL in response to a scanning signal received from the gate line GL. The capacitor Cst charges a voltage to correspond to the data signal received from the first transistor T1. The second transistor T2 is connected to the organic light emitting diode OLED. The second transistor T2 controls the driving current that flows through the organic light emitting diode OLED to correspond to the amount of charge stored in the capacitor Cst.

The equivalent circuit of FIG. 5 is exemplary and non-limiting. According to embodiments, the pixel PX may further include a plurality of transistors and a plurality of capacitors, and the organic light emitting diode OLED may be connected between the power line PL and the second transistor T2.

In addition, according to an embodiment, the organic light emitting diode OLED provided in the pixel PX is disposed in the display element layer ED of FIG. 3A, and the transistors T1 and T2 are disposed in the circuit element layer COL.

Figure 6A:
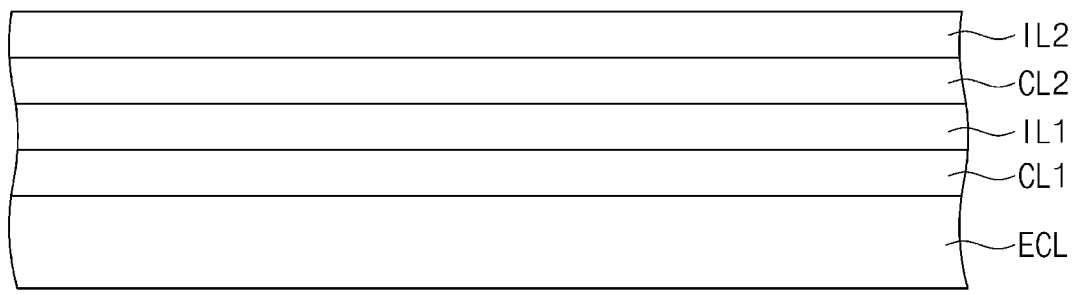
FIG. 6A is a cross-sectional view of an input sensing unit according to an embodiment of the inventive concept.
Figure 6B:
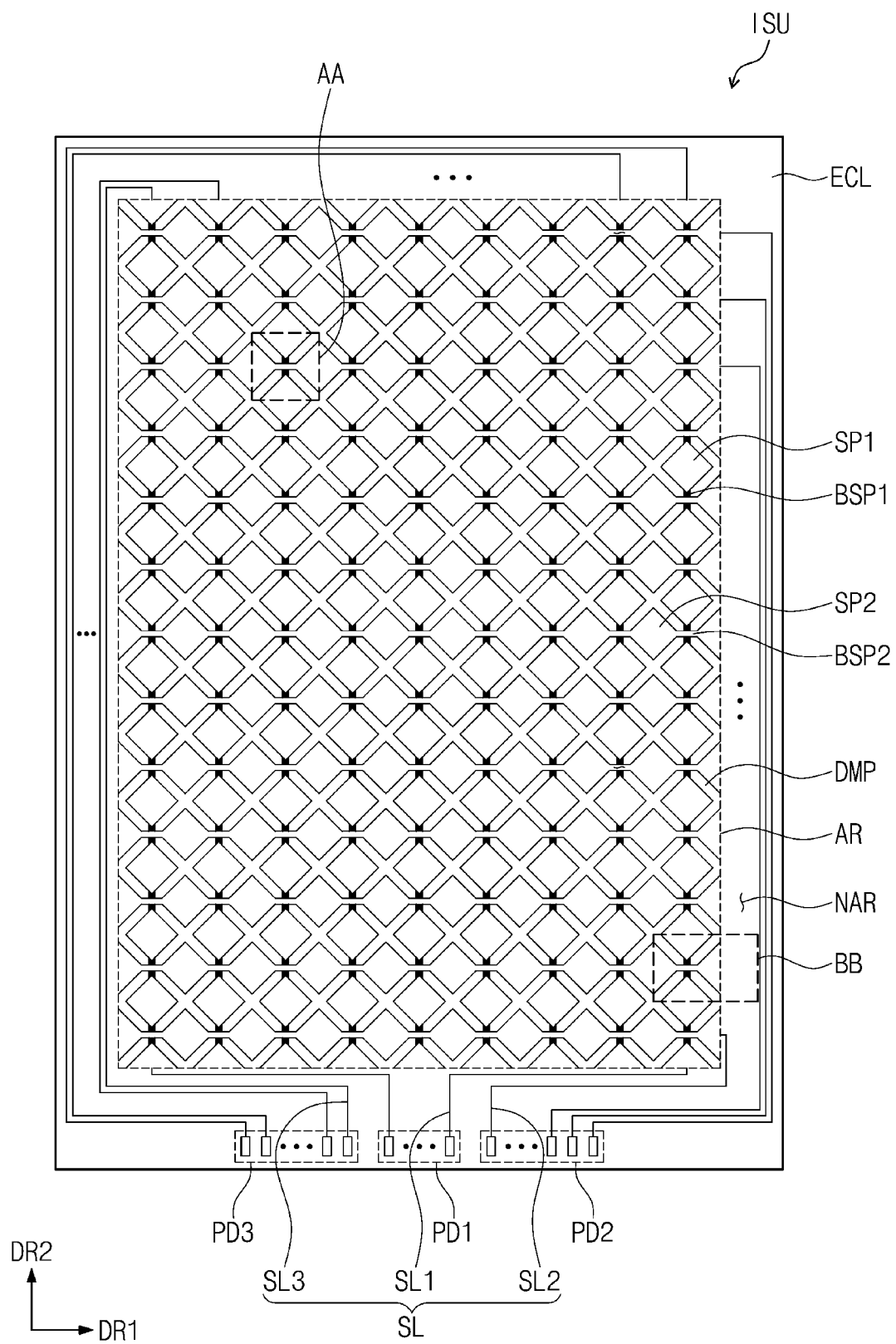
FIG. 6B is a plan view of an input sensing unit according to an embodiment of the inventive concept.
Figure 7:
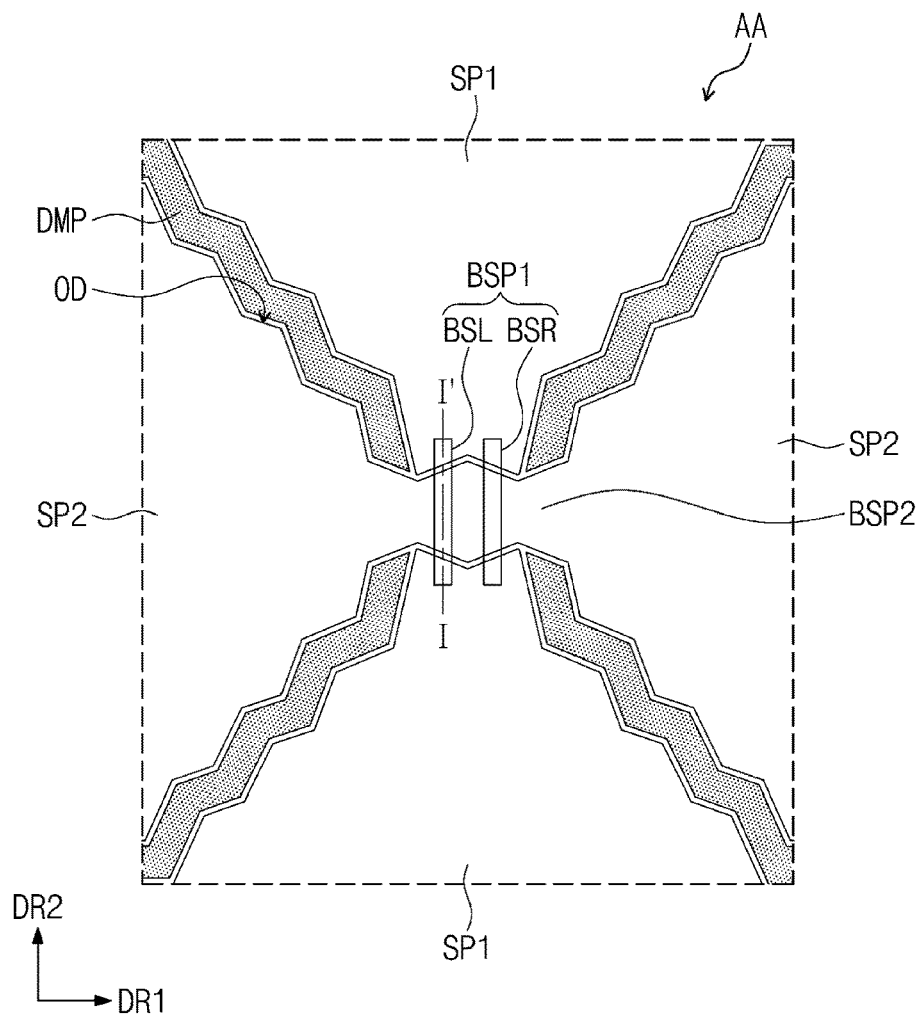
FIG. 7 is an enlarged view of a region AA of FIG. 6.
Figure 8:
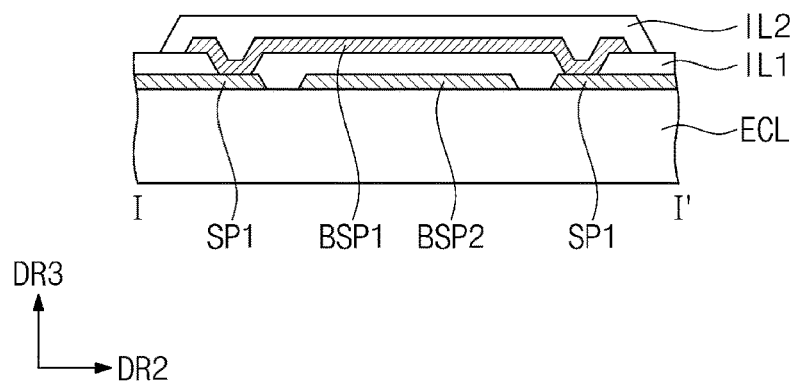
FIG. 8 is a cross-sectional view taken along line I-I' of FIG. 7.

FIG. 6A is a cross-sectional view of an input sensing unit according to an embodiment of the inventive concept. FIG. 6B is a plan view of a input sensing unit according to an embodiment of the inventive concept. FIG. 7 is an enlarged view of a region AA of FIG. 6B. FIG. 8 is a cross-sectional view taken along line I-I' of FIG. 7.

Referring to FIG. 6A, according to an embodiment, the input sensing unit ISU is disposed on the encapsulation layer ECL. As described above, the input sensing unit ISU may be directly disposed on the encapsulation layer ECL or may be disposed through the adhesion member. Hereinafter, according to an embodiment of the inventive concept, an input sensing unit ISU directly disposed on the encapsulation layer ECL will be described.

According to an embodiment, the input sensing unit ISU include a first conductive layer CL1, a second conductive layer CL2, a first insulation layer IL1, and a second insulation layer IL2.

According to an embodiment, the first conductive layer CL1 is directly disposed on the encapsulation layer ECL. The first insulation layer IL1 covers the first conductive layer CL1 and is disposed on the encapsulation layer ECL. The second conductive layer CL2 is disposed on the first conductive layer CL1. The second insulation layer IL2 covers the second conductive layer CL2 and is disposed on the first insulation layer IL1. However, this is merely an example. According to another embodiment, the second insulation layer IL2 is omitted.

Referring to FIG. 6B, according to an embodiment, the input sensing unit ISU includes an active area AR and a non-active area NAR adjacent to the active area AR. The active area AR of the input sensing unit ISU overlaps the display area DP-DA of the display panel DP that is disclosed above. The non-display area DP-NDA of the display panel DP overlaps the non-active area NAR of the input sensing unit ISU. The non-active area NAR is may be adjacent to one, two or three sides of the active area AR, or may be omitted. Hereinafter, according to an embodiment of the inventive concept, the active area AR is where an externally applied input is sensed.

In detail, according to an embodiment, the input sensing unit ISU includes first sensing electrodes, second sensing electrodes, first connection patterns BSP1, second connection patterns BSP2, a plurality of sensing lines SL, and a plurality of first to third pads PD1, PD2, and PD3.

According to an embodiment, the first sensing electrodes and the second sensing electrodes overlap the active area AR. The first sensing electrodes extend in the second direction DR2 and are arranged in the first direction DR1. A plurality of n first sensing electrodes, where n is a natural number, are provided. Each of the first sensing electrodes includes a plurality of first sensing patterns SP1 spaced apart from each other in the plan view and arranged in the second direction DR2.

According to an embodiment, the second sensing electrodes extend in the first direction DR1 and are arranged in the second direction DR2. A plurality of m second sensing electrodes, where m is a natural number, are provided. Each of the second sensing electrodes includes a plurality of second sensing patterns SP2 spaced apart from each other in the plan view and arranged in the first direction DR1. The second sensing patterns SP2 are spaced apart from and insulated from the first sensing patterns SP1.

According to an embodiment, the first connection patterns BSP1 connect the first sensing patterns SP1 to each other. For example, one first connection pattern BSP1 electrically connects to each other two adjacent first sensing patterns SP1 in the second direction DR2.

According to an embodiment, the second connection patterns BSP2 connect the second sensing patterns SP2 to each other. For example, one second connection pattern BSP2 electrically connects to each other two second adjacent sensing patterns SP2 in the first direction DR1.

According to an embodiment, the first connection pattern BSP1 and the second connection pattern BSP2 cross each other in the plan view and are insulated from each other in a cross-sectional view.

According to an embodiment of the inventive concept, the first sensing patterns SP1, the second sensing patterns SP2, and the second connection patterns BSP2 are directly disposed on the encapsulation layer ECL. That is, the first sensing patterns SP1, the second sensing patterns SP2, and the second connection patterns BSP2 are provided in the first conductive layer CL1 described with reference to FIG. 6A. In addition, each of the first sensing patterns SP1, the second sensing patterns SP2, and the second connection patterns BSP2 include a transparent conductive oxide.

According to an embodiment, the transparent conductive oxide includes at least one of indium zinc oxide (IZO), indium tin oxide (ITO), indium gallium oxide (IGO), indium zinc gallium oxide (IGZO), or a mixture/compound thereof. However, embodiments of the inventive concept are not limited thereto.

According to an embodiment of the inventive concept, the first connection patterns BSP1, the sensing lines SL, and the first to third pads PD1, PD2, and the PD3 are provided in the second conductive layer CL2 described with reference to FIG. 6A. As a result, the first connection patterns BSP1, the sensing lines SL, and the first to third pads PD1, PD2, and the PD3 are disposed on the first insulation layer IL1.

In particular, according to an embodiment, each of the first connection patterns BSP1, the sensing lines SL, and the first to third pads PD1, PD2, and the PD3 includes a metal. The metal includes, for example, molybdenum, silver, titanium, copper, aluminum, or an alloy thereof.

According to an embodiment, the sensing lines SL include first sensing lines SL1, second sensing lines SL2, and third sensing lines SL3 that overlap the non-active area NAR. Each of the first to third sensing lines SL1 to SL3 includes a metal.

According to an embodiment, the of the first sensing lines SL has one end connected to one end of each of the first sensing patterns SP1 and the other end connected to each of the first pads PD1. The first sensing patterns SP1 connected to the ends of the first sensing lines SL1 are first column sensing patterns that are spaced apart from each other in the first direction DR1.

According to an embodiment, each of the second sensing lines SL2 has one end connected to one end of each of the second sensing patterns SP2 and the other end connected to each of the second pads PD2. The second sensing patterns SP2 connected to the ends of the second sensing lines SL2 are second column sensing patterns spaced apart from each other in the second direction DR2.

According to an embodiment, each of the third sensing lines SL3 has one end connected to one end of each of the first sensing patterns SP1 and the other end connected to each of the third pads PD3. The first sensing patterns SP1 connected to the ends of the third lines SL3 are third column sensing patterns that are spaced apart from each other in the first direction DR1.

According to an embodiment, the first to third sensing lines SL to SL3 receive electrical signals from the first to third pads PD1 to PD3, respectively. The first to third pads PD1 to PD3 receive a driving signal through the circuit board PCB described with reference to FIG. 4 or are electrically connected to a separate circuit board to receive a driving signal.

According to an embodiment, the first to third sensing lines SL1 to SL3 transmit the driving signals received from the first to third pads PD1 to PD3 to the first sensing patterns SP1 and the second sensing patterns SP2 disposed on the active area AR. In addition, the first to third sensing lines SL1 to SL3 transmit external input signals generated on the active area AR to the corresponding pads of the first to third pads PD1 to PD3.

Referring to FIG. 7, according to an embodiment, two first sensing patterns SP1, one connection patterns BSP1 that connects the two first sensing patterns SP1 to each other, two sensing patterns SP2, and one second connection pattern BSP2 that connect the two sensing patterns SP2 to each other are illustrated as an example.

According to an embodiment of the inventive concept, the first connection pattern BSP1 includes a first branch part BSL and a second branch part BSR. The first branch part BSL and the second branch part BSL are spaced apart from each other in the first direction DR1. Each of the first branch part BSL and the second branch part BSL extends in the second direction DR2. The first connection pattern BSP1 overlaps the second connection pattern BSP2 in the plan view.

According to an embodiment of the inventive concept, a dummy pattern DMP is disposed between the first sensing patterns SP1 and the second sensing patterns SP2 in the plan view. The dummy pattern DMP is disposed on a boundary between the first sensing patterns SP1 and the second sensing patterns SP2, with a space OD between the dummy pattern DMP and each of the first sensing patterns SP1 and each of the second sensing patterns SP2. That is, the dummy pattern DMP is a floating pattern that is spaced apart from each of the first sensing patterns SP1 and the second sensing patterns SP2. The dummy pattern DMP prevents gaps between the first sensing patterns SP1 and the second sensing patterns SP2 from being visible.

In addition, according to an embodiment, as illustrated in FIG. 7, although each of the first sensing patterns SP1, the second sensing patterns SP2, and the dummy pattern DMP has a stair shape, embodiments of the inventive concept are not limited thereto. For example, each of the first sensing patterns SP1, the second sensing patterns SP2, and the dummy pattern DMP may have a linear shape or a groove shape. Since the dummy pattern DMP has a stair shape in FIG. 7, a sensing surface area for the external input is increased as compared to a different shape with the same surface area. Thus, an input sensing unit having improved touch sensitivity can be provided.

Referring to FIG. 8, according to an embodiment, the first sensing patterns SP1 and the second connection patterns BSP2 are disposed on the encapsulation layer ECL. The second connection pattern BSP2 is covered by the first insulation layer IL1. The first connection pattern BSP1 is disposed on the first insulation layer IL1. Portions of the first sensing patterns SP1 are exposed by contact holes formed in the first insulation layer IL1. The portions of the first sensing patterns SP1 exposed by the contact holes of the first insulation layer IL1 are connected to the first connection patterns BSP1. As a result, as illustrated in FIG. 8, two first sensing patterns SP1 that are spaced apart from each other in the second direction DR2 are electrically connected to each other by the first connection pattern BSP1.

According to an embodiment, the first connection pattern BSP1 is covered by the second insulation layer IL2. According to an embodiment of the inventive concept, each of the first connection patterns BSP1, the sensing lines SL, and the first to third pads PD1, PD2, and PD3 that are provided in the second conductive layer CL2, are deposited on the first insulation layer IL1 through one deposition mask.

In addition, according to an embodiment, the second insulation layer IL2 is disposed on the first insulation layer IL1 and overlaps the first connection patterns BSP1, the sensing lines SL, and the first to third pads PD1, PD2, and the PD3 through one deposition mask. Thus, the overall manufacturing process of the display device DD can be simplified to reduce manufacturing costs.

In addition, according to an embodiment of the inventive concept, the second insulation layer IL2 does not overlap at least a portion of the active area AR. That is, the second insulation layer IL2 overlaps each of the first connection patterns BSP1 in the second conductive layer CL2 in the active area AR, but does not overlap the remaining areas. As a result, the second insulation layer IL2 does not overlap the second sensing patterns SP2 and at least a portion of the first sensing patterns SP1.

Figure 9:
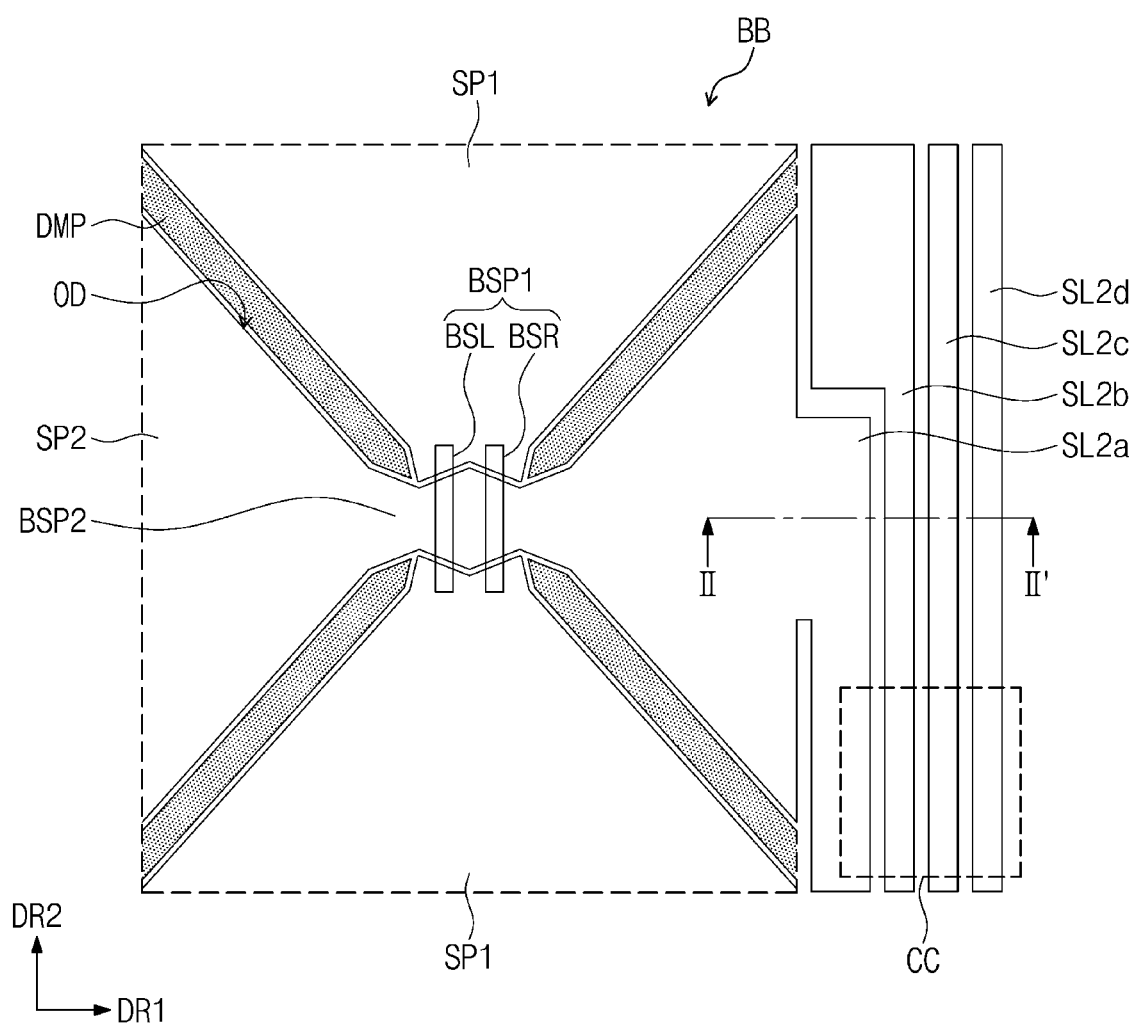
FIG. 9 is an enlarged view of a region BB of FIG. 6.
Figure 10:
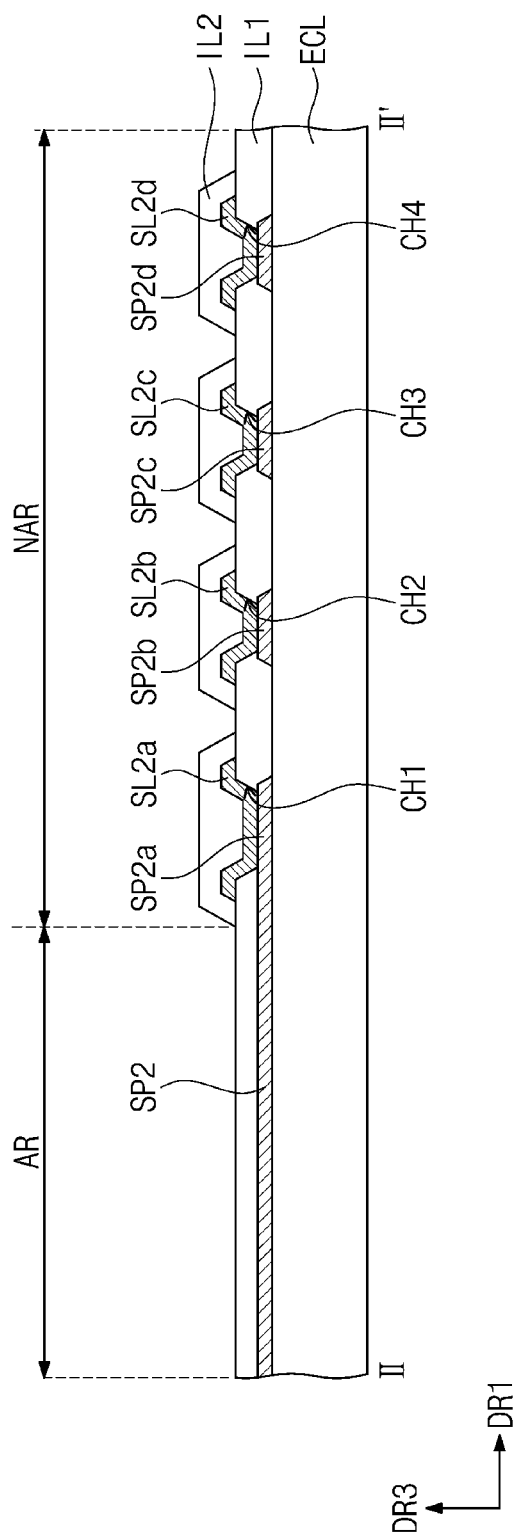
FIG. 10 is a cross-sectional view taken along line II-II' of FIG. 9.

FIG. 9 is an enlarged view of a region BB of FIG. 6. FIG. 10 is a cross-sectional view taken along line II-II' of FIG. 9.

Referring to FIG. 9, according to an embodiment, a portion of the second sensing lines SL2 connected to the second sensing patterns SP2 of the sensing patterns SL described with reference to FIG. 6B is illustrated as an example. Hereinafter, first to fourth sensing lines SL2a, SL2b, SL2c, and SL2d of the second sensing lines SL2 will be described. In addition, although not shown, a structure of each of the first to fourth sensing lines SL2a, SL2b, SL2c, and SL2d, which will be described below, is the same for the remaining sensing lines.

As described above, according to an embodiment, the first to fourth sensing lines SL2a, SL2b, SL2c, and SL2d transmit driving signals to the second sensing patterns SP2. When one of the first to fourth sensing lines SL2a, SL2b, SL2c, and SL2d is disconnected, the driving signal is not transmitted to the sensing pattern associated with the disconnected sensing line. As a result, the display device has reduced driving reliability.

However, according to an embodiment of the inventive concept, the first conductive layer CL1 includes a plurality of auxiliary lines electrically and respectively contacting the sensing lines SL. In addition, the first conductive layer CL1 includes a plurality of auxiliary pads electrically and respectively connected to the first to third pads PD1, PD2, and PD3.

In detail, according to an embodiment, referring to FIG. 10, the first to fourth sensing lines SL2a, SL2b, SL2c, and SL2d overlap the non-active area NAR, and the second sensing pattern SP2 overlap the active area AR. According to an embodiment of the inventive concept, the first insulation layer IL1 includes a plurality of first to fourth contact holes CH1, CH2, CH3, and CH4 that respectively overlap the first to fourth sensing lines SL2a, SL2b, SL2c, and SL2d. The number of contact holes in the first insulation layer IL1 corresponds to the number of sensing lines.

According to an embodiment, the first conductive layer CL1 includes first to fourth auxiliary lines SP2a, SP2b, SP2c, and SP2d that contact the first to fourth sensing lines SL2a, SL2b, SL2c, and SL2d through the first to fourth contact holes CH1, CH2, CH3, and CH4, respectively. The number of auxiliary lines provided in the first conductive layer CL1 corresponds to the number of sensing lines.

In addition, according to an embodiment, the first to fourth auxiliary lines SP2a, SP2b, SP2c, and SP2d are directly connected to the second sensing patterns SP2. For example, the first auxiliary line SP2a is connected to one second sensing pattern SP2.

As illustrated in FIG. 10, according to an embodiment, a dual line structure is provided in which electrical connections are realized through the first to fourth sensing lines SL2a, SL2b, SL2c, and SL2d and the first to fourth auxiliary lines SP2a, SP2b, SP2c, and SP2d. As a result, for example, even if the first sensing line SL2a becomes disconnected, the driving signal can be transmitted to the sensing pattern through the first auxiliary line SP2a that electrically contacts the first sensing line SL2a.

The sensing line can be oxidized through contact with external air, and as a result, the sensing lines can become disconnected due to corrosion. However, according to an embodiment of the inventive concept, each of the first to fourth auxiliary lines SP2a, SP2b, SP2c, and SP2d is made of transparent conductive oxide and is thus prevented from oxidizing.

As described above, according to an embodiment, the overall driving reliability of a display device can be improved through a dual line structure between the first to fourth auxiliary lines SP2a, SP2b, SP2c, and SP2d and the first to fourth sensing lines SL2a, SL2b, SL2c, and SL2d.

According to an embodiment, the second insulation layer IL2 covers each of the first to fourth sensing lines SL2a, SL2b, SL2c, and SL2d and be disposed on the first insulation layer IL1. In particular, according to an embodiment of the inventive concept, the second insulation layer IL2 overlaps the first to fourth sensing lines SL2a, SL2b, SL2c, and SL2d on the non-active area NAR and does not overlap the remaining areas. This is done because the first to fourth sensing lines SL2a, SL2b, SL2c, and SL2d are formed through the above-described one mask. For example, the second insulation layer IL2 has a structure that overlaps the first to fourth sensing lines SL2a, SL2b, SL2c, and SL2d.

Figure 11A:
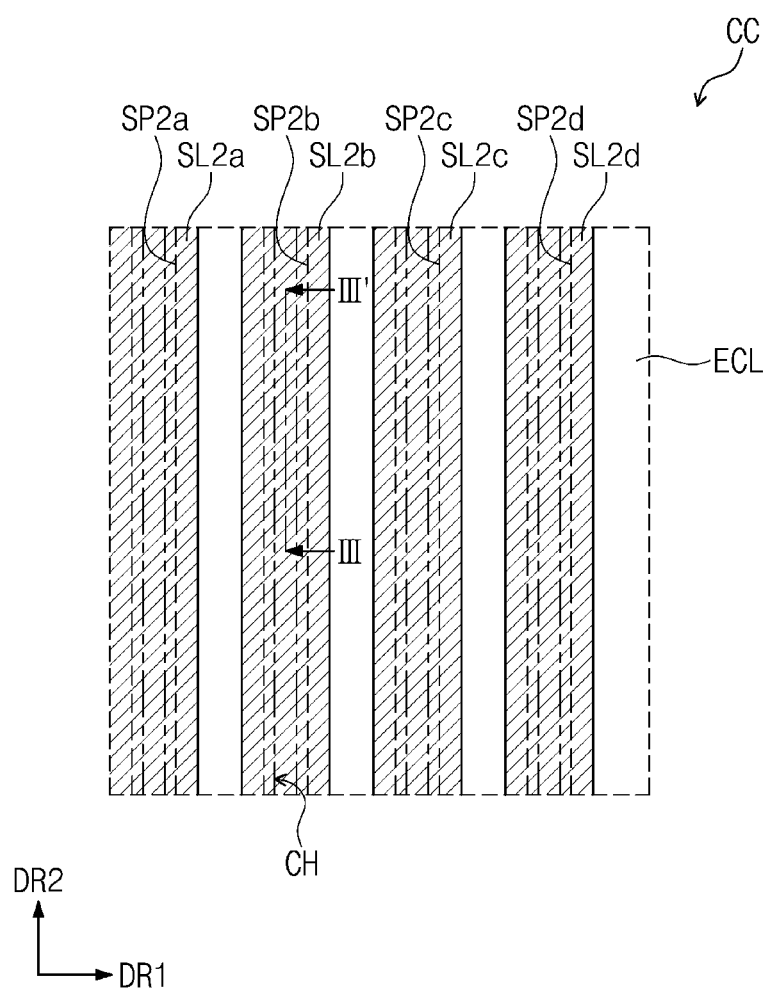
FIG. 11A is an enlarged view of an area CC of FIG. 9 according to an embodiment of the inventive concept.
Figure 11B:
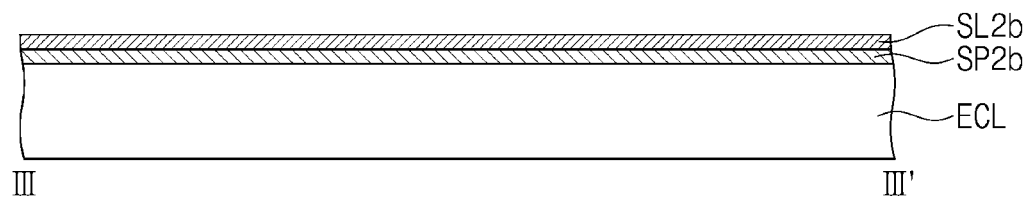
FIG. 11B is a cross-sectional view taken along line III-III' of FIG. 11.
Figure 11B:
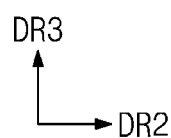

FIG. 11A is an enlarged view of an area CC of FIG. 9 according to an embodiment of the inventive concept. FIG. 11B is a cross-sectional view taken along line II-III' of FIG. 11.

Referring to FIG. 11A, according to an embodiment, the first to fourth auxiliary lines SP2a, SP2b, SP2c, and SP2d entirely overlap the first to fourth sensing lines SL2a, SL2b, SL2c, and SL2d, respectively. That is, one of the first to fourth auxiliary lines SP2a, SP2b, SP2c, and SP2d entirely overlaps one of the first to fourth sensing lines SL2a, SL2b, SL2c, and SL2d. Hereinafter, a structure of the second auxiliary line SP2b and the second sensing line SL2b will be mainly described. The remaining auxiliary lines and sensing lines also have the same structure therebetween.

As illustrated in FIG. 11A, according to an embodiment, the second auxiliary line SP2b and the second sensing line SL2B may contact each other through the contact hole CH. The contact hole CH is formed in the first insulation layer IL1 as illustrated in FIG. 10 and entirely overlaps the second auxiliary line SP2b. In particular, the contact hole CH has a shape that extends along the length of the second auxiliary line SP2b.

For example, according to an embodiment, as illustrated in FIG. 11B, the second auxiliary line SP2b and the second sensing line SL2b extend in the second direction DR2 in contact with each other. The contact hole CH is formed for each of the first to fourth auxiliary lines SP2a, SP2b, SP2c, and SP2d.

Figure 12A:
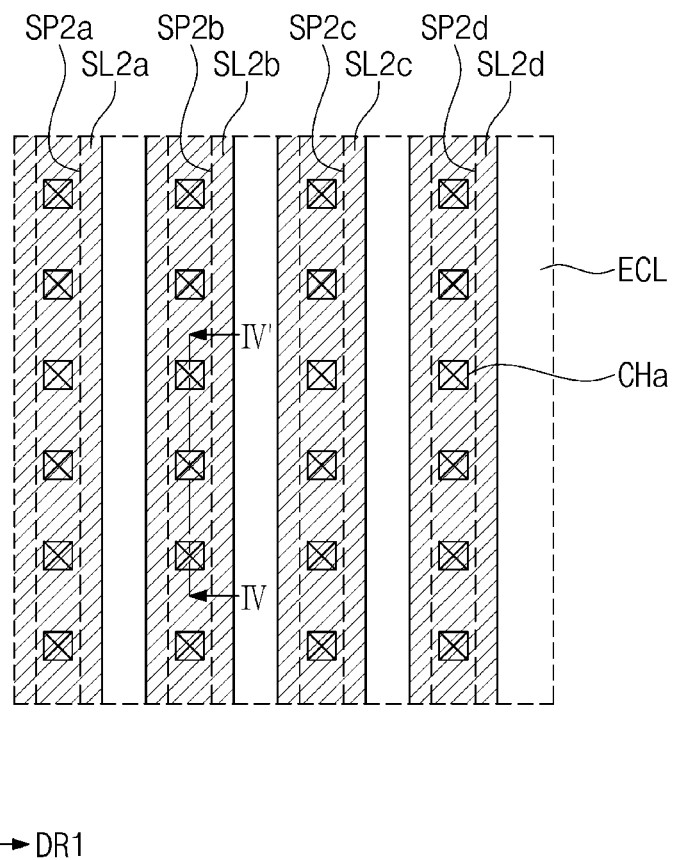
FIG. 12A is an enlarged view of an area CC of FIG. 9 according to another embodiment of the inventive concept.
Figure 12B:
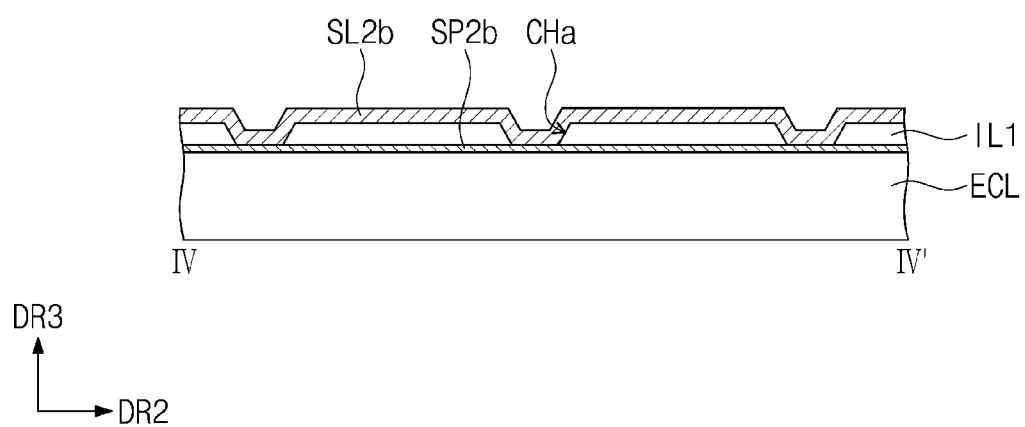
FIG. 12B is a cross-sectional view taken along line IV-IV' of FIG. 12A.

FIG. 12A is an enlarged view of an area CC of FIG. 9 according to another embodiment of the inventive concept. FIG. 12B is a cross-sectional view taken along line IV-IV' of FIG. 12A.

FIG. 12A illustrates a structure of a contact hole according to another embodiment of the inventive concept. In detail, referring to FIGS. 12A and 12B, the first insulation layer IL1 includes a plurality of sub contact holes CHa that respectively overlap the first to fourth auxiliary lines SP2a, Sp2b, SP2c, and Sp2d. The sub contact holes CHa are arranged in and be spaced apart from each other a longitudinal direction of each of the auxiliary lines in the plan view. The auxiliary lines will be mainly described based on the connection structure between the second sensing line SL2b and the second auxiliary line SP2b in the second direction DR2, and the remaining sensing lines and auxiliary lines also have the same structure therebetween.

Referring to FIG. 12B, according to an embodiment, the second sensing line SL2b and the second auxiliary line SP2b extend in the second direction DR2. The first insulation layer IL1 includes contact holes CHa spaced apart from each other in the second direction DR2, and the second sensing line SL2b and the second auxiliary line SP2b contact each other through the contact holes CHa.

Figure 13:
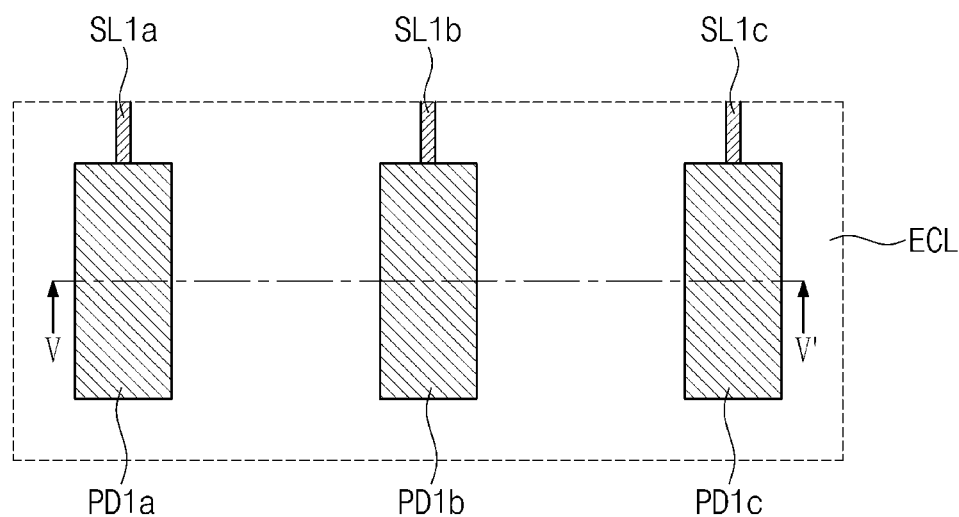
FIG. 13 is a plan view of a portion of first pads of FIG. 6B according to an embodiment of the inventive concept.
Figure 14:
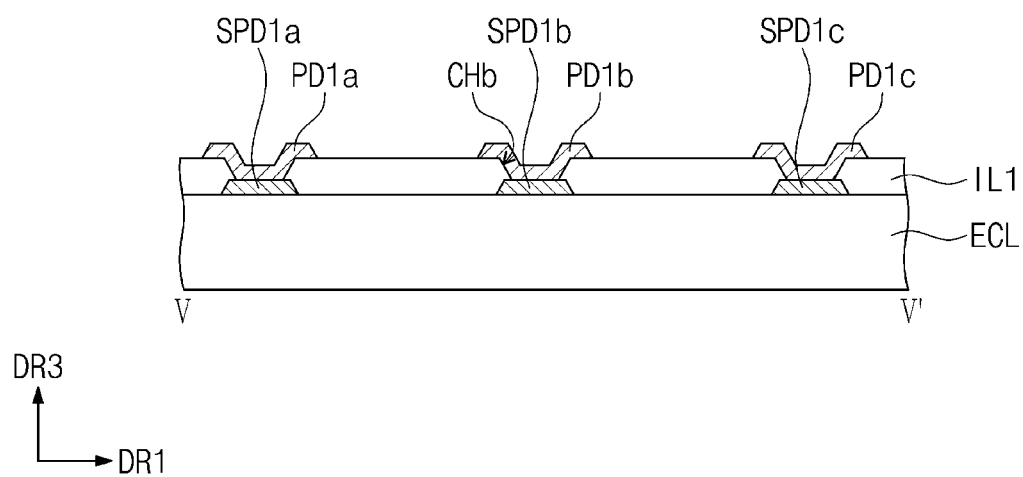
FIG. 14 is a cross-sectional view taken along line V-V' of FIG. 13.

FIG. 13 is a plan view of a portion of first pads of FIG. 6B according to an embodiment of the inventive concept. FIG. 14 is a cross-sectional view taken along line V-V' of FIG. 13.

According to an embodiment, the pad illustrated in FIG. 13 is an example of a portion of the first pads PD1 of FIG. 6B. Hereinafter, first to third pads PD1a, PD1b, and PD1c of the first pads PD1 will be described with reference to FIG. 13.

In detail, according to an embodiment, referring to FIG. 13, one end of each of the first to third pads PD1a, PD1b, and PD1c is connected to one end of each of the first to third sensing lines SL1a, SL1b, and SL1c. The first to third pads PD1a, PD1b, and PD1c are electrically connected to pads on an external circuit boards to receive driving signals.

According to an embodiment, the second conductive layer CL2 disposed on the first insulation layer IL1 is also provided in the first to third pads PD1a, PD1b, and PD1c. In particular, the first insulation layer IL1 includes a plurality of contact holes CHb that overlap the first to third pads PD1a, DP1b, and PD1c.

Referring to FIG. 14, according to an embodiment, the first to third pads PD a, PD1b, and PD1c are electrically connected to auxiliary pads through the contact holes CHb. For example, FIG. 14 illustrates the first to third auxiliary pads SPD1a, SPD1b, and SPD1c respectively connected to the first to third pads PD1a, PD1b, and PD1c.

According to an embodiment, the first to third auxiliary pads SPD1a, SPD1b, and SPD1c are disposed on the encapsulation layer ECL and are provided in the first conductive layer CL1. Each of the first to third auxiliary pads SPD1a, SPD1b, and SPD1c is made of transparent conductive oxide.

As described above, according to an embodiment, the overall driving reliability of the display device can be improved through a dual line structure between the first to third auxiliary pads SPD1a, SPD1b, and SPD1c and the first to third pads PD1a, PD1b, and PD1c.

According to embodiments of the inventive concept, the driving signals are transmitted to the sensing electrodes through the dual line structure. Therefore, the overall driving reliability of the display device is improved.

As described above, exemplary embodiments are disclosed in the drawings and the specification. While specific terms were used, they are not used to limit the meaning or the scope of embodiments of the inventive concept recited in claims, but are used to explain exemplary embodiments of the inventive concept. Accordingly, a person having ordinary skill in the art will understand from the above that various modifications and other equivalent embodiments are also possible. Hence, the real protective scope of the present invention shall be determined by the technical scope of the accompanying claims.

What is claimed is:

1. A display module, comprising:
   a display panel; and,
   an input sensing unit disposed on the display panel and that includes an active area and a non-active area adjacent to the active area;
   wherein the input sensing unit comprises:
   a first conductive layer disposed on the display panel and that includes a plurality of sensing electrodes that overlap the active area and a plurality of auxiliary lines that overlap the non-active area and are electrically connected to the sensing electrodes;
   a first insulation layer that includes a plurality of contact holes that respectively overlap the auxiliary lines and are disposed on the first conductive layer;
   a second conductive layer disposed on the first insulation layer and that includes a plurality of sensing lines that overlap the non-active area and respectively contact the auxiliary lines through the contact holes; and
   a second insulation layer disposed on the second conductive layer,
   wherein one end of each of the auxiliary lines is directly connected to each of the sensing electrodes and each of the sensing lines is electrically connected to each of the sensing electrodes through the each of the auxiliary lines.

2. The display module of claim 1, wherein a first auxiliary line of the auxiliary lines entirely overlaps a first sensing line of the sensing lines.

3. The display module of claim 2, wherein
   the first auxiliary line and the first sensing line contact each other through a first contact hole of the contact holes, and
   the first contact hole extends along a length of the first auxiliary line.

4. The display module of claim 2, wherein
   the first auxiliary line and the first sensing line contact each other through a first contact hole of the contact holes, and
   the first contact hole comprises a plurality of sub contact holes spaced apart from each other in a plan view, wherein the sub contact holes are arranged along a length of the first auxiliary line.

5. The display module of claim 1, wherein
   the second conductive layer further includes a plurality of pads that overlap the non-active area and are respectively connected to the sensing lines, and
   the first conductive layer further includes a plurality of auxiliary pads that are respectively connected to the auxiliary lines.

6. The display module of claim 5,
   wherein the first insulation layer further includes a plurality of auxiliary contact holes,
   wherein the auxiliary pads respectively contact the pads through the plurality of auxiliary contact holes.

7. The display module of claim 1, wherein the second insulation layer covers each of the sensing lines, is disposed on the first insulation layer, and does not overlap at least a portion of the non-active area.

8. The display module of claim 1, wherein
   the sensing electrodes include a plurality of first sensing patterns that overlap the active area and a plurality of second sensing patterns spaced apart from the first sensing patterns in a plan view,
   the second conductive layer further includes a plurality of first connection patterns that connect two adjacent first sensing patterns to each other, and
   the first conductive layer further includes a plurality of second connection patterns that connect two adjacent second sensing patterns to each other.

9. The display module of claim 8, wherein
   the second insulation layer covers each of the first connection patterns and is disposed on the first insulation layer, and
   the second insulation layer does not overlap at least a portion of the active area.

10. The display module of claim 9, wherein the second insulation layer does not overlap the second sensing patterns and a portion of the first sensing patterns.

11. The display module of claim 8,
wherein each of the first sensing patterns, the second sensing patterns, and the second connection patterns includes a transparent conductive oxide, and
wherein each of the first connection patterns and the sensing lines comprises a metal.

12. The display module of claim 1, wherein the display panel comprises:
a base substrate;
a display element layer disposed on the base substrate; and
an encapsulation layer that seals the display element layer,
wherein the sensing electrodes and the auxiliary lines are disposed on the encapsulation layer.

13. The display module of claim 12, wherein the display module further includes a sealant that connects the encapsulation layer to the base substrate.

14. A display device comprising:
a display module that includes an active area on which an external input is sensed and a non-active area adjacent to the active area; and
a window disposed on the display module,
wherein the display module comprises:
a first conductive layer that includes a plurality of sensing electrodes that overlap the active area and a plurality of auxiliary lines that overlap the non-active area and are electrically connected to the sensing electrodes;
an insulation layer that includes a plurality of contact holes that respectively overlap the auxiliary lines and are disposed on the first conductive layer; and
a second conductive layer disposed on the insulation layer and that includes a plurality of sensing lines that overlap the non-active area and respectively contact the auxiliary lines through the contact holes,
wherein one end of each of the auxiliary lines is directly connected to each of the sensing electrodes and each of the sensing lines is electrically connected to each of the sensing electrodes through the each of the auxiliary lines.

15. The display device of claim 14, wherein the auxiliary lines entirely overlap the sensing lines, respectively.

16. The display device of claim 14, further comprising an auxiliary insulation layer disposed on the second conductive layer,
wherein the auxiliary insulation layer does not overlap a portion of each of the active area and the non-active area.

17. The display device of claim 16, wherein
each of the sensing electrodes and the auxiliary lines is made of a transparent conductive oxide, and
each of the sensing lines is made of a metal.

18. A display module, comprising:
a display panel; and
an input sensing unit disposed on the display panel and that includes, an active area and a non-active area adjacent to the active area;
wherein the input sensing unit comprises:
a first conductive layer that includes a plurality of sensing electrodes that overlap the active area and a plurality of auxiliary lines that overlap the non-active area and are electrically connected to the sensing electrodes;
a first insulation layer that includes a plurality of contact holes that respectively overlap the auxiliary lines and are disposed on the first conductive layer; and
a second conductive layer that includes a plurality of sensing lines that overlap the non-active area and respectively contact the auxiliary lines through the contact holes,
wherein a first auxiliary line of the auxiliary lines entirely overlaps a first sensing line of the sensing lines, and
wherein the first auxiliary line and the first sensing line are in contact with each other.

19. The display module of claim 18, further comprising a second insulation layer disposed on the second conductive layer,
wherein the second insulation layer covers each of the sensing lines, is disposed on the first insulation layer, and does not overlap at least a portion of the non-active area.

* * * * *